(12) United States Patent
Klene et al.

(10) Patent No.: US 7,016,388 B2
(45) Date of Patent: Mar. 21, 2006

(54) LASER LITHOGRAPHY LIGHT SOURCE WITH BEAM DELIVERY

(75) Inventors: Brian Klene, La Jolla, CA (US); Palash P. Das, Vista, CA (US); Steve Grove, Poway, CA (US); Alexander Ershov, San Diego, CA (US); Scot Smith, San Diego, CA (US); Xiaojiang Pan, San Diego, CA (US); Richard L. Sandstrom, Encinitas, CA (US)

(73) Assignee: Cymer, Inc., San Diego, CA (US)

( * ) Notice: Subject to any disclaimer, the term of this patent is extended or adjusted under 35 U.S.C. 154(b) by 219 days.

(21) Appl. No.: 10/712,688

(22) Filed: Nov. 12, 2003

(65) Prior Publication Data

US 2004/0105479 A1 Jun. 3, 2004

Related U.S. Application Data

(63) Continuation of application No. 10/141,216, filed on May 7, 2002, now Pat. No. 6,693,939.

(51) Int. Cl.
*H01S 3/22* (2006.01)

(52) U.S. Cl. .......................................... 372/55; 372/58
(58) Field of Classification Search ................. 372/25, 372/55–68, 92, 93, 99, 101, 107, 96, 69–73
See application file for complete search history.

(56) References Cited

U.S. PATENT DOCUMENTS

| | | | |
|---|---|---|---|
| 4,223,279 A | 9/1980 | Bradford, Jr. et al. | 331/94.5 |
| 4,455,658 A | 6/1984 | Sutter et al. | 372/38 |
| 4,959,840 A | 9/1990 | Akins et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,359,620 A | 10/1994 | Akins | 372/58 |
| 5,448,580 A | 9/1995 | Birx et al. | 372/38 |
| 5,471,965 A | 12/1995 | Kapich | 123/565 |
| 5,852,621 A | 12/1998 | Sandstrom | 372/25 |
| 5,863,017 A | 1/1999 | Larson et al. | 248/176.1 |
| 5,953,360 A | 9/1999 | Vitruk et al. | 372/87 |
| 5,978,394 A | 11/1999 | Newman et al. | 372/32 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A * | 2/2000 | Carlesi et al. | 372/58 |
| 6,067,311 A | 5/2000 | Morton et al. | 372/57 |
| 6,094,448 A | 7/2000 | Fomenkov et al. | 372/102 |

(Continued)

*Primary Examiner*—Tuan N. Nguyen
(74) *Attorney, Agent, or Firm*—William C. Cray; Cymer, Inc.

(57) ABSTRACT

The present invention provides a modular high repetition rate ultraviolet gas discharge laser light source for a production line machine. The system includes an enclosed and purged beam path for delivery the laser beam to a desired location such as the entrance port of the production line machine. In preferred embodiments, the production line machine is a lithography machine and two separate discharge chambers are provided, one of which is a part of a master oscillator producing a very narrow band seed beam which is amplified in the second discharge chamber. This MOPA system is capable of output pulse energies approximately double the comparable single chamber laser system with greatly improved beam quality. A pulse stretcher more than doubles the output pulse length resulting in a reduction in pulse power (mJ/ns) as compared to prior art laser systems. This preferred embodiment is capable of providing illumination at a lithography system wafer plane which is approximately constant throughout the operating life of the lithography system, despite substantial degradation of optical components.

28 Claims, 14 Drawing Sheets

U.S. PATENT DOCUMENTS

| | | | |
|---|---|---|---|
| 6,104,735 A | 8/2000 | Webb | 372/37 |
| 6,128,323 A | 10/2000 | Myers et al. | 372/38 |
| 6,151,349 A | 11/2000 | Gong et al. | 372/58 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 | 5/2001 | Gong et al. | 372/58 |
| 6,330,261 B1 | 12/2001 | Ishihara et al. | 372/38.1 |
| 6,414,979 B1 * | 7/2002 | Ujazdowski et al. | 372/87 |
| 6,477,193 B1 * | 11/2002 | Oliver et al. | 372/58 |
| 6,693,939 B1 * | 2/2004 | Klene et al. | 372/58 |
| 2002/0021728 A1 | 2/2002 | Newman et al. | 372/55 |

* cited by examiner

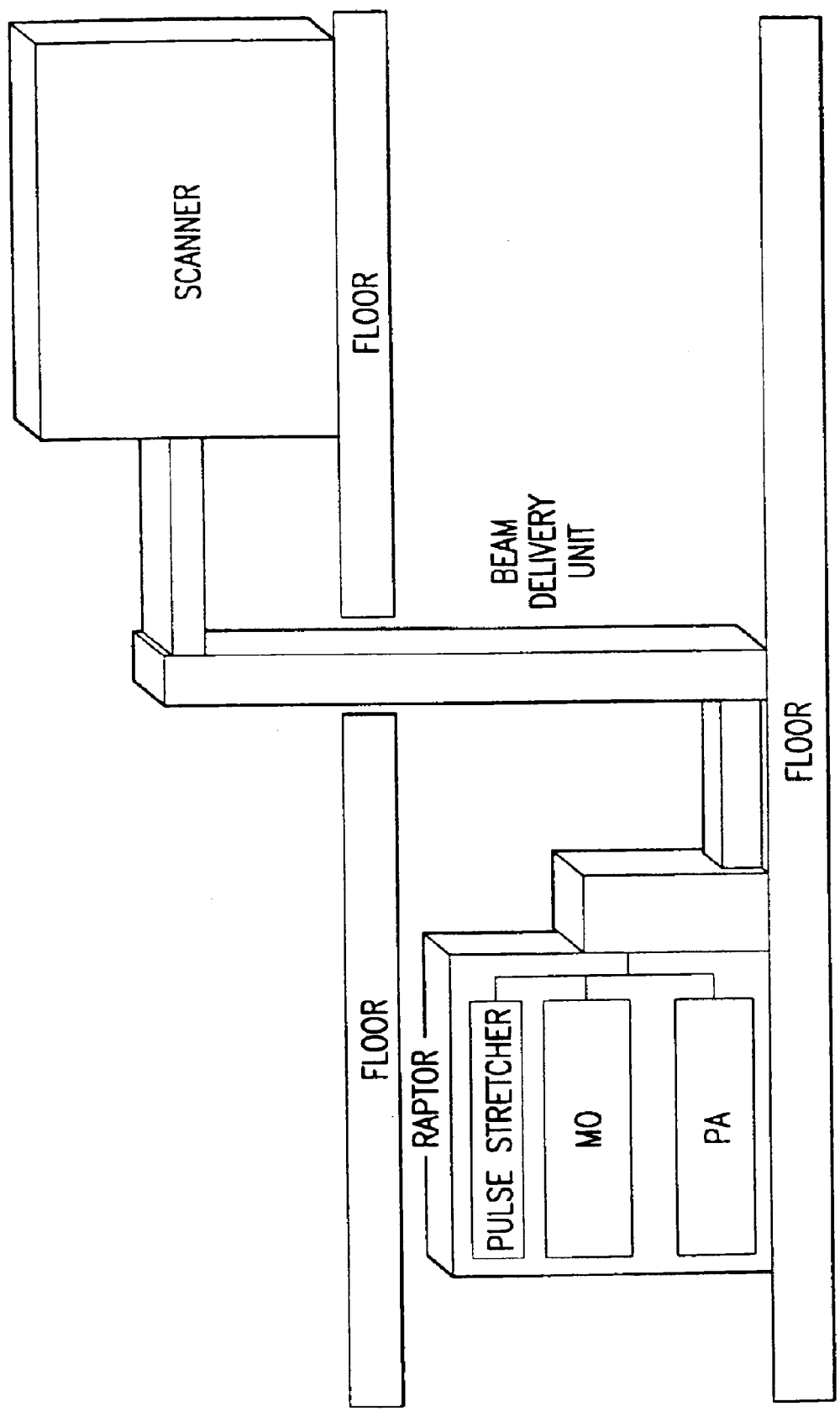

LASER LITHOGRAPHY LIGHT SOURCE WITH BEAM DELIVERY

This application is a continuation of U.S. application Ser. No. 10/141,216, filed May 7, 2002 now U.S. Pat. No. 6,693,939, all of which is incorporated herein by reference. This invention relates to lithography light sources for integrate circuit manufacture and especially to gas discharge laser lithography light sources for integrated circuit manufacture.

BACKGROUND OF THE INVENTION

Electric Discharge Gas Lasers

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser.

These excimer lasers, when used for integrated circuit lithography, are typically operated in an integrated circuit fabrication line "around-the-clock" producing many thousands of valuable integrated circuits per hour; therefore, down-time can be very expensive. For this reason most of the components are organized into modules which can be replaced within a few minutes. Excimer lasers used for lithography typically must have its output beam reduced in bandwidth to a fraction of a picometer. This "line-narrowing" is typically accomplished in a line narrowing module (called a "line narrowing package" or "LNP" for KrF and ArF lasers) which forms the back of the laser's resonant cavity (A line selection unit "LSU" is used for selecting a narrow spectral band in the $F_2$ laser). The LNP is comprised of delicate optical elements including prisms, mirrors and a grating. Electric discharge gas lasers of the type described in Patent '884 utilize an electric pulse power system to produce the electrical discharges, between the two elongated electrodes. In such prior art systems, a direct current power supply charges a capacitor bank called a "charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

Major Advances in Lithography Light Sources

Excimer lasers such as described in the '884 patent have during the period 1989 to 2001 become the primary light source for integrated circuit lithography. More than 1000 of these lasers are currently in use in the most modern integrated circuit fabrication plants. Almost all of these lasers have the basic design features described in the '884 patent. This is:

(1) a single, pulse power system for providing electrical pulses across the electrodes at pulse rates of about 100 to 2500 pulses per second;
(2) a single resonant cavity comprised of a partially reflecting mirror-type output coupler and a line narrowing unit consisting of a prism beam expander, a tuning mirror and a grating;
(3) a single discharge chamber containing a laser gas (either krypton, fluorine and neon for KrF or argon, fluorine and neon for ArF), two elongated electrodes and a tangential fan for circulating the laser gas between the two electrodes fast enough to clear the discharge region between pulses, and
(4) a beam monitor for monitoring pulse energy, wavelength and bandwidth of output pulses with a feedback control system for controlling pulse energy, energy dose and wavelength on a pulse-to-pulse basis.

During the 1989–2001 period, output power of these lasers has increased gradually and beam quality specifications for pulse energy stability, wavelength stability and bandwidth have become increasingly tighter. Operating parameters for a popular lithography laser model used widely in integrated circuit fabrication include pulse energy at 8 mJ, pulse rate at 2,500 pulses per second (providing an average beam power of up to about 20 watts), bandwidth at about 0.5 pm full width half maximum (FWHM) and pulse energy stability at +/−0.35%.

Injection Seeding

A well-known technique for reducing the bandwidth of gas discharge laser systems (including excimer laser systems) involves the injection of a narrow band "seed" beam into a gain medium. In some of these systems a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated to build and operate than comparable single chamber laser systems. Therefore, commercial application of these two chamber laser systems has been limited.

Separation of Lithography Machine from Light Source

For integrated circuit fabrication the lithography machine is typically located separate from the lithography laser light source. The separation is typically 2 to 20 meters. Sometimes the laser and the lithography machine are located in separate rooms. A typical practice is to locate the laser in a room one floor below the lithography machine. The laser beam is ultraviolet at wavelengths of about 248 nm for KrF lasers, 193 nm for ArF lasers and 157 nm for $F_2$ lasers.

Ultraviolet light especially at the shorter wavelengths of the ArF and $F_2$ lasers is absorbed by oxygen, therefore it is a well known practice to enclose the laser beam path between the laser and the lithography and to purge the enclosure with a gas such as nitrogen which provides much lower beam attenuation than air. Included within the enclosure also are a variety of optical components including mirrors and lenses for directing the laser beam to a desired beam entrance port in the lithography machine and providing any needed modification to the beam, such as changes in cross-sectional profile. The equipment for delivering the laser beam to the lithography machine is called a beam delivery unit or "BDU" for short. In the past the BDU has typically been designed and supplied separate from the laser light source.

What is needed is a better laser design for a pulse gas discharge laser for operation at repetition rates in the range of about 4,000 pulses per second or greater, providing laser light at the entrance port of the lithography machine having beam quality parameters including wavelength, bandwidth, pulse energy and cross-sectional profile needed by the lithography machine.

SUMMARY OF THE INVENTION

The present invention provides a modular high repetition rate ultraviolet gas discharge laser light source for a production line machine. The system includes an enclosed and purged beam path for delivery the laser beam to a desired location such as the entrance port of the production line machine. In preferred embodiments, the production line machine is a lithography machine and two separate discharge chambers are provided, one of which is a part of a master oscillator producing a very narrow band seed beam which is amplified in the second discharge chamber. This MOPA system is capable of output pulse energies approximately double the comparable single chamber laser system with greatly improved beam quality. A pulse stretcher more than doubles the output pulse length resulting in a reduction in pulse power (mJ/ns) as compared to prior art laser systems. This preferred embodiment is capable of providing illumination at a lithography system wafer plane which is approximately constant throughout the operating life of the lithography system, despite substantial degradation of optical components.

BRIEF DESCRIPTION OF THE DRAWINGS

FIGS. 4A, 4B and 4C show beam delivery configurations.

DETAILED DESCRIPTION OF PREFERRED EMBODIMENTS

Figure 1:
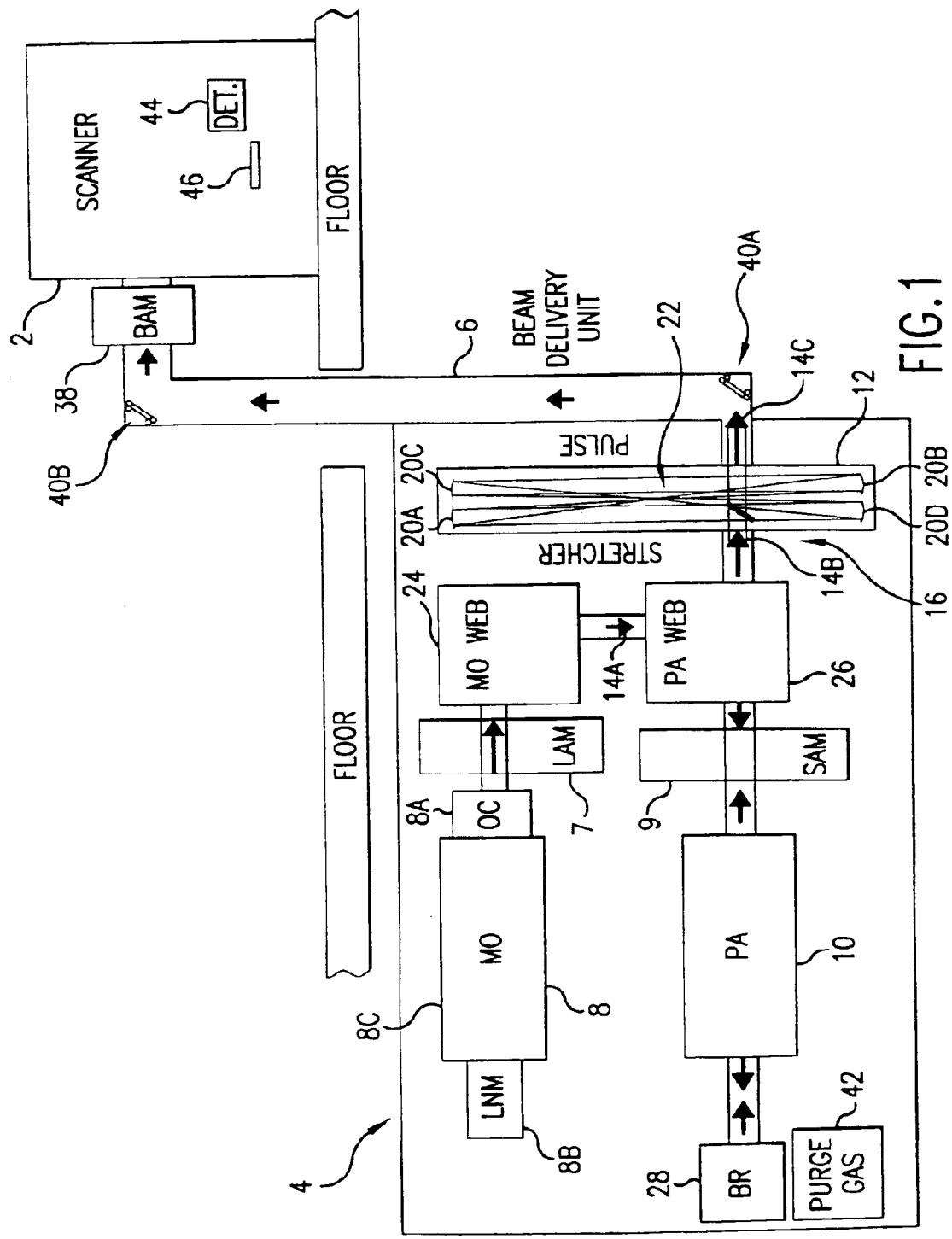
FIG. 1 is a layout of a lithography laser system with a beam delivery unit.

A first preferred embodiment of the present invention is shown in FIG. 1. In this embodiment a 193 nm ultraviolet laser beam is provided at the input port of a stepper lithography machine 2 such as the one of those supplied by Canon and Nikon with facilities in Japan and ASML with facilities in the Netherlands. In this case the main components of the laser system 4 are installed below the deck on which the scanner is installed. However, this laser system includes a beam delivery unit 6 which provides an enclosed beam path for delivering the laser beam to the input port of the scanner.

This particular laser system includes a master oscillator and a power amplifier 10 and is a type of laser system known as MOPA system. This MOPA arrangement represents an important advancement in integrated circuit light sources over the prior art technique of using a single laser oscillator to provide the laser light. The master oscillator and the power amplifier each comprise a discharge chamber similar to the discharge chamber of prior art single chamber lithography laser systems. These chambers contain two elongated electrodes, a laser gas, a tangential for circulating the gas between the electrodes and water-cooled finned heat exchangers. The master oscillator produces a first laser beam 14A which is amplified by two passes through the power amplifier to produce laser beam 14B. The master oscillator 8 comprises a resonant cavity formed by output coupler 8A and line narrowing package 8B both of which are described generally in the background section and in detail in the referenced prior art patents. The gain medium for master oscillator 8 is produced between two 50-cm long electrodes contained within master oscillator discharge chamber 8C. Power amplifier 10. It is basically a discharge chamber and in this preferred embodiment is almost exactly the same as the master oscillator discharge chamber 8C providing a gain medium between two elongated electrodes but it has no resonant cavity. This MOPA configuration permits the master the master oscillator to be designed and operated to maximize beam quality parameters such as wavelength stability, very narrow bandwidth; whereas the power amplifier is designed and operated to maximize power output. For example, the current state of the art light source available from Cymer, Inc. Applicants' employer, is a 5 mJ per pulse, 4 kHz, ArF laser system. The system shown in FIG. 1 is a 10 mJ per pulse (or more, if desired) 4 kHz ArF laser system producing at least twice the average ultraviolet power with substantial improvement in beam quality. For this reason the MOPA system represents a much higher quality and much higher power laser light source.

Pulse Stretcher

Figure 2:
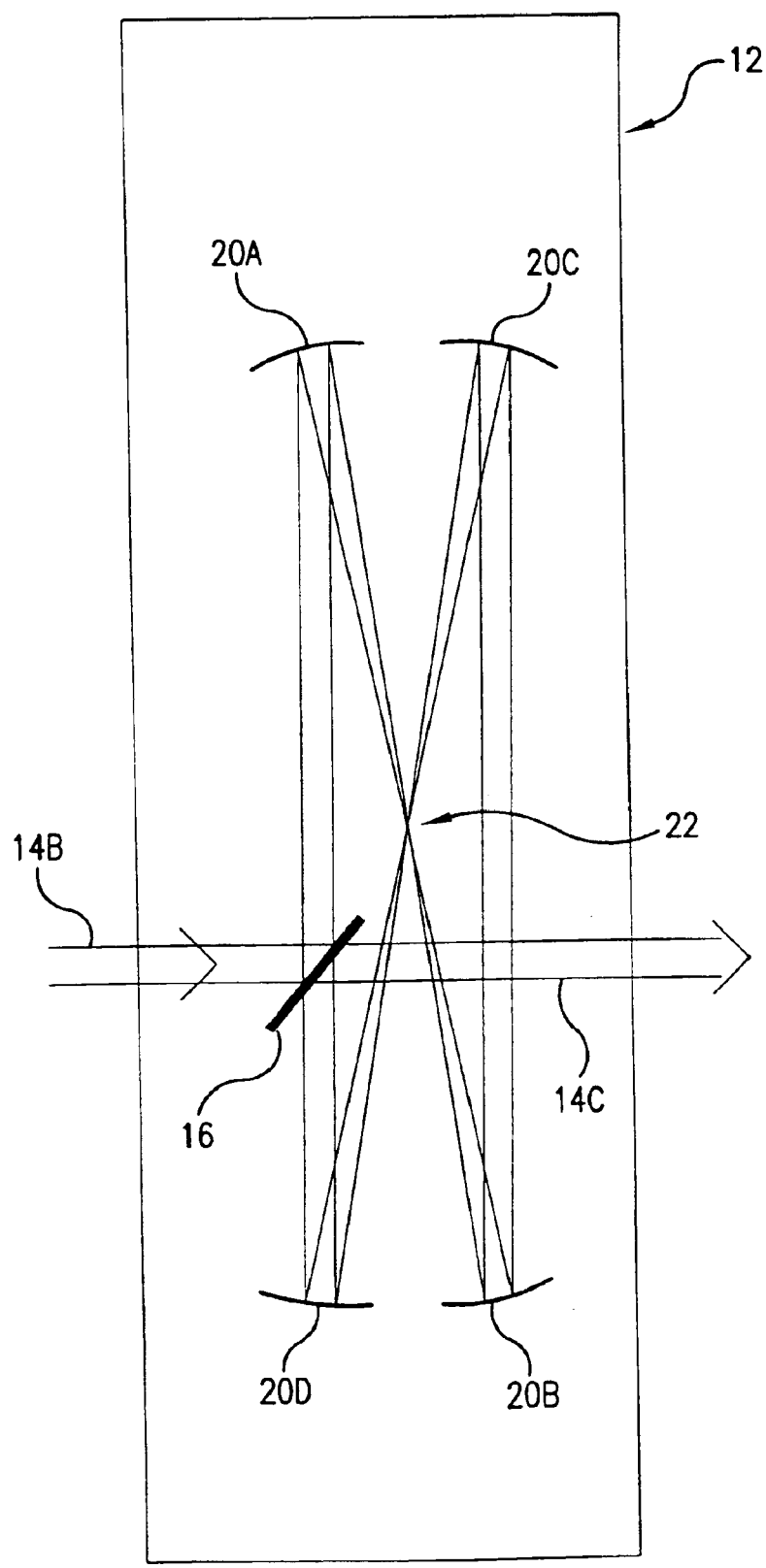
FIGS. 2, 2A and 2D show features of a pulse stretching unit.
Figure 2A:
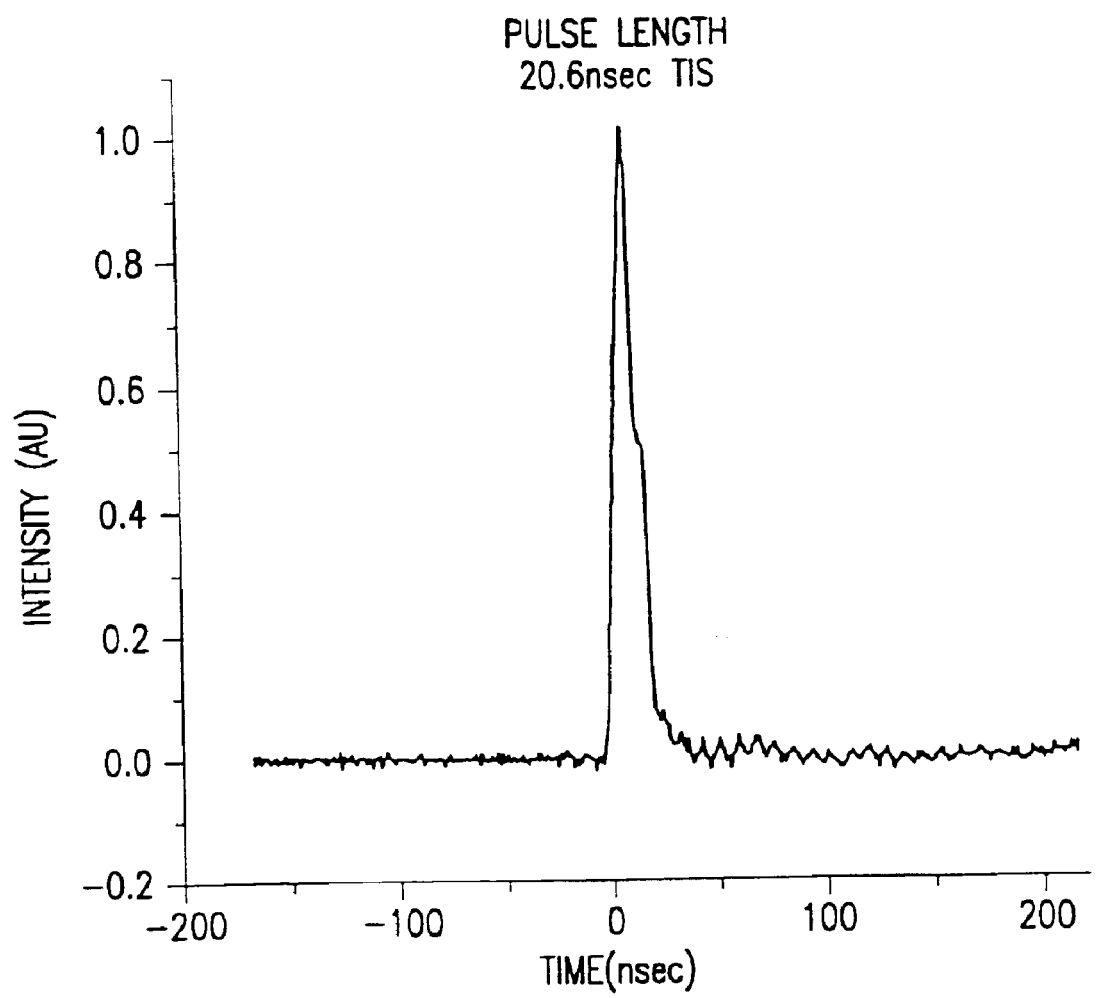
Figure 2B:
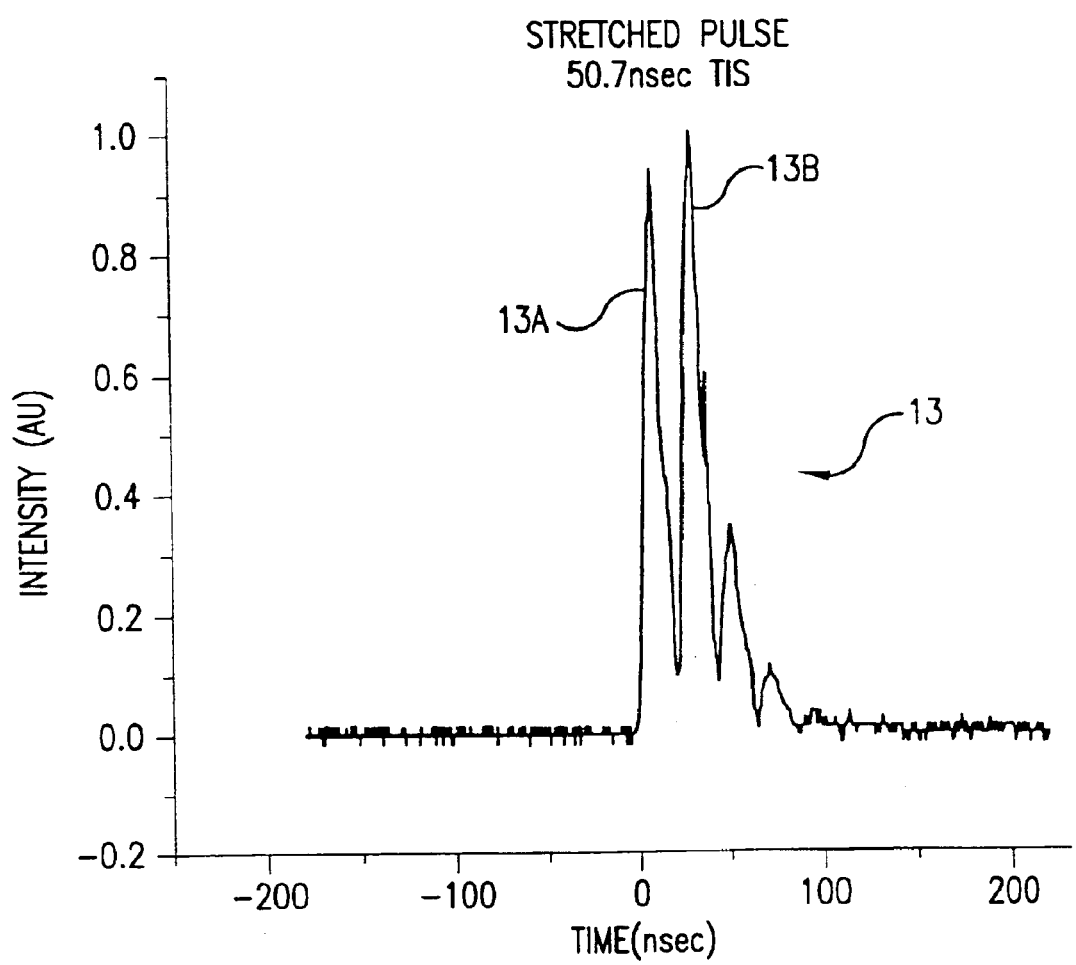

Integrated circuit scanner machines comprise large lenses which are difficult to fabricate and costs millions of dollars. These very expensive optical components are subject to degradation resulting from billions of high intensity and ultraviolet pulses. Optical damage is known to increase with increasing intensity (i.e., light power (energy/time) per $cm^2$ or $mJ/ns/cm^2$) of the laser pulses. The typical pulse length of the laser beam from these lasers is about 20 ns so a 5 mJ beam would have a pulse power intensity of about 0.25 mJ/ns. Increasing the pulse energy to 10 mJ without changing the pulse duration would result a doubling of the power of the pulses to about 0.5 mJ/ns which could significantly shorten the usable lifetime of these expensive optical components. The Applicants have avoided this problem by increasing substantially the pulse length from about 20 ns to more than 50 ns providing a reduction in the rate of scanner optics degradation. This pulse stretching is achieved with pulse stretcher unit 12 as shown in FIG. 1. An enlarged view showing the beam paths through pulse stretcher 12 is shown in FIG. 2. A beam splitter 16 reflects about 60 percent of the power amplifier output beam 14B into a delay path created by four focusing mirrors 20A, 20B, 20C and 20D. The 40 percent transmitted portion of each pulse of beam 14B becomes a first hump 13A of a corresponding stretched pulse 13 shown in FIG. 2B of beam 14C. The stretched beam 14C is directed by beam splitter 16 to mirror 20A which focuses the reflected portion to point 22. The beam then expands and is reflected from mirror 20B which converts the expanding beam into a parallel beam and directs it to mirror 20C which again focuses the beam again at point 22. This beam is then reflected by mirror 20D which like the 20B mirror changes the expanding beam to a light parallel beam and directs it back to beam splitter 16 where 60 percent of the first reflected light is reflected perfectly in line with the first transmitted portion of this pulse in output beam 14C to become most of hump 13B in pulse 13 as shown in FIG. 2B. The 40 percent of the reflected beam transmits beam splitter 14 and follows exactly the path of the first reflected beam producing additional smaller humps in stretched pulse 13. The result is stretched pulse 14C which is stretched in pulse length from about 20 ns to about 50 ns. The stretch pulse 14C is plotted as intensity vs. time in FIG. 2B and can be compared with the shape of the power amplifier output pulse 14B which is similarly plotted in FIG. 2A.

The stretched pulse shape with this embodiment has two large approximately equal peaks 13A and 13B with smaller diminishing peaks following in time the first two peaks. The shape of the stretched pulse can be modified by using a different beam splitter. Applicants' have determined that a beam splitter reflecting about 60 percent produces the maximum stretching of the pulse as measured by a parameter known as the "time integrated square" pulse length or "TIS". Use of this parameter is a technique for determining the effective pulse duration of pulses having oddly shaped power vs. time curves. The TIS defined as:

$$t_{IS} = \frac{(\int I(t)dt)^2}{\int I^2(t)dt}$$

Where I(t) is the intensity as a function of time.

In order to maintain the beam profile and divergence properties, the mirrors that direct the beam through the delay propagation path must create an imaging relay system that also should act as a unity, magnification, focal telescope. The reason for this is because of the intrinsic divergence of the excimer laser beam. If the beam were directed through a delay path without being imaged, the beam would be a different size than the original beam when it is recombined at the beam splitter. To create the imaging relay and afocal telescope functions of the pulse stretcher the mirrors are designed with a specific radius of curvature which is determined by the length of the delay path. The separation between mirrors 20A and 20D is equal to the radius of curvature of the concave surfaces of the mirrors and is equal to ¼ the total delay path.

The relative intensities of the first two peaks in the stretched pulse can be modified with the design of the reflectivity of the beam splitter. Also, the design of the beam splitter and therefore the output TIS of the pulse stretcher are dependent upon the efficiency of the beam relay system and therefore the output TIS is also subject to the amount of reflectivity of the imaging relay mirrors and the amount of loss at the beam splitter. For an imaging relay mirror reflectivity of 97% and a loss of 2% at the beam splitter, the maximum TIS magnification occurs when the reflectivity of the beam splitter is 63%.

The alignment of the pulse stretcher requires that two of the four imaging relay mirrors be adjustable. Each of the two adjustable mirrors would have tip/tilt adjustment creating a total of four degrees of freedom. It is necessary that the two adjustable mirrors be located at opposite ends of the system because of the confocal design of the system. To create a self-aligning pulse stretcher would require automated adjustment of the necessary four degrees of freedom and a diagnostic system which could provide feedback information to characterize the alignment. The design of such a diagnostic system, which could qualify the alignment performance, would require an imaging system capable of imaging both the near field and far field output of the pulse stretcher. By examining the overlay of the sub-pulses with the original pulse at two planes (near field and far field) one would have the necessary information to automatically adjust the mirrors to produce an output where each of the sub-pulses propagate in a co-linear manner with the original pulse.

Relay Optics

In this preferred embodiment the output beam 14A of the master oscillator 8 is amplified by two passes through power amplifier 10 to produce output beam 14B. The optical components to accomplish this are contained in three modules which Applicants have named: master oscillator wave front engineering box, MO WEB, 24, power amplifier wavefront engineering box, PA WEB, 26 and beam reverser, BR, 28. These three modules along with line narrowing module 8B and output coupler 8A are all mounted on a single vertical optical table independent of discharge chamber 8C and the discharge chamber of power amplifier 10. Chamber vibrations caused by acoustic shock and fan rotation must be isolated from the optical components.

Figure 3A:
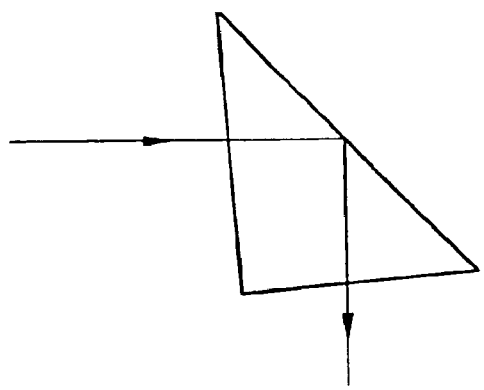
FIGS. 3A, 3B, 3C, 3D, 3E, 3F and 3G show features of a relay optics for the FIG. 1 laser system.

The optical components in the master oscillator line narrowing module and output coupler are in this embodiment substantially the same as those of prior art lithography laser light sources referred to in the background section. The line narrowing module includes a three or four prism beam expander, a very fast response tuning mirror and a grating disposed in Litrow configuration. The output coupler is a partially reflecting mirror reflecting 20 percent of the output beam for KrF systems and about 30 percent for ArF and passing the remainder. The output of master oscillator 8 is monitored in line center analysis module, LAM, 7 and passes into the MO WEB 24. The MO WEB contains a total internal reflection (TIR) prism and alignment components for precisely directing the output beam 14A into the PA WEB. TIR prisms such as the one shown in FIG. 3A can turn a laser beam 90 degrees with more than 90 percent efficiency without need for reflective coatings which typically degrade under high intensity ultraviolet radiation. Alternatively, a first surface mirror with a durable high reflection coating could be used in place of the TIR prism.

The PA WEB 26 contains a TIR prism 26A as shown in FIGS. 3C–F and alignment components (not shown) for directing laser beam 14A into a first pass through power amplifier gain medium. Alternatively, as above a first surface mirror with a high reflection coating could be substituted for the TIR prism. The beam reverser module 28 contains a two-reflection beam reversing prism 26B shown in FIGS. 3B–D that like the one-reflection prism shown in FIG. 3A relies on total internal reflection and therefore requires no optical coatings. The face where the P-polarized beam enters and exits the prism is oriented at Brewster's angle to minimize reflection lasers, making the prism almost 100% efficient.

Figure 3B:
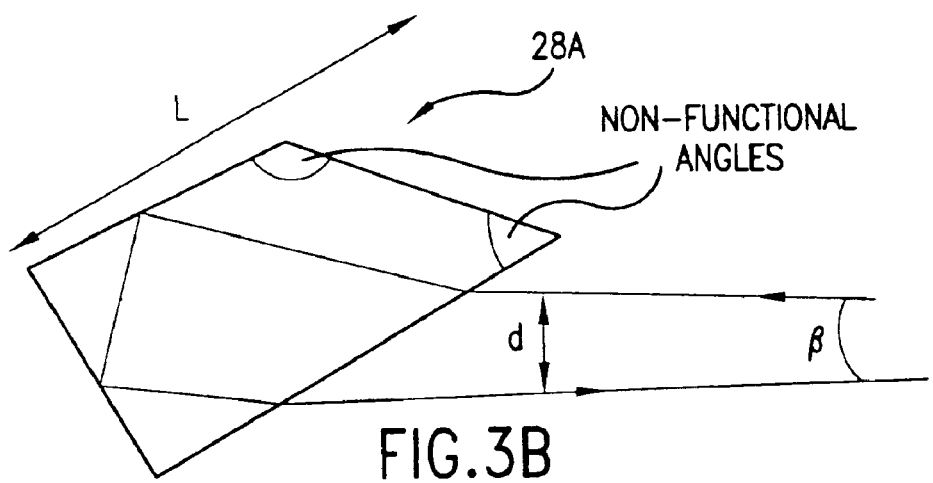
Figure 3C:
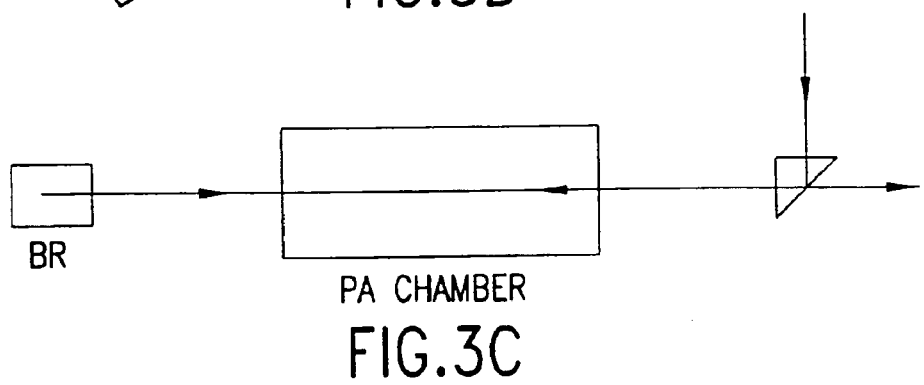
Figure 3D:
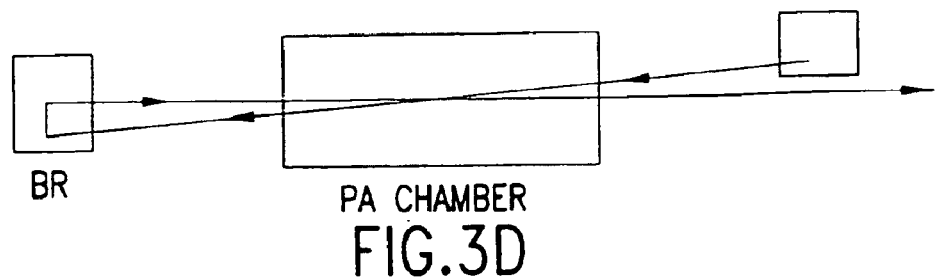

After reversal in the beam reversing module 28, partially amplified beam 14A makes another pass through the gain medium in power amplifier 10 and exits through spectral analysis module 9 and PA WEB 26 as power amplifier output beam 14B. In this embodiment the second pass of beam 14A through power amplifier 10 is precisely in line with the elongated electrodes within the power amplifier discharge chamber. The first pass follows a path at an angle of about 6 milliradians relative to the path of the second pass and the first path of the first pass crosses the center line of the gain medium at a point half way between the two ends of the gain medium. FIGS. 3C and 3D show side and top views of the path of beam 14A through the power amplifier. The reader should note that the design and positioning of beam reversing prism 28A must accommodate an angle β and a spatial offset of d as shown in FIG. 3B. In this embodiment β=6 milliradians and d is equal to 5 mm.

Figure 3E:
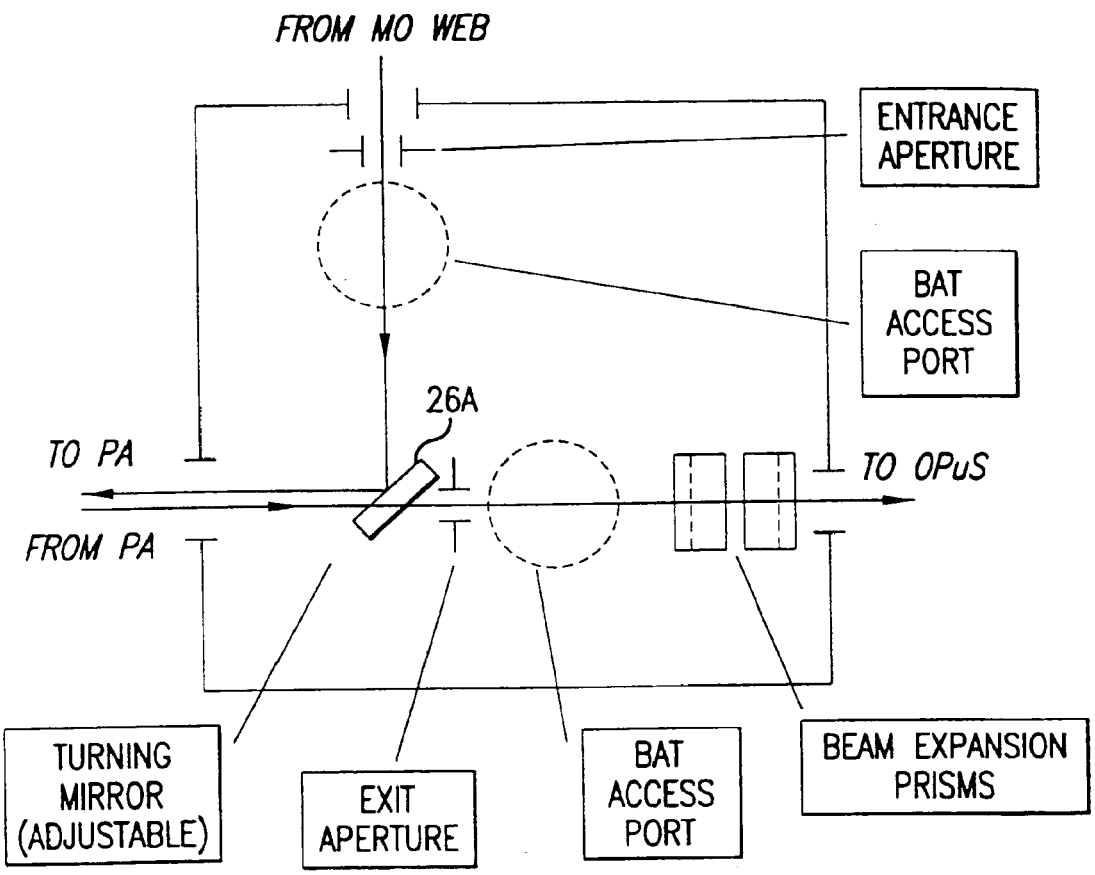
Figure 3F:
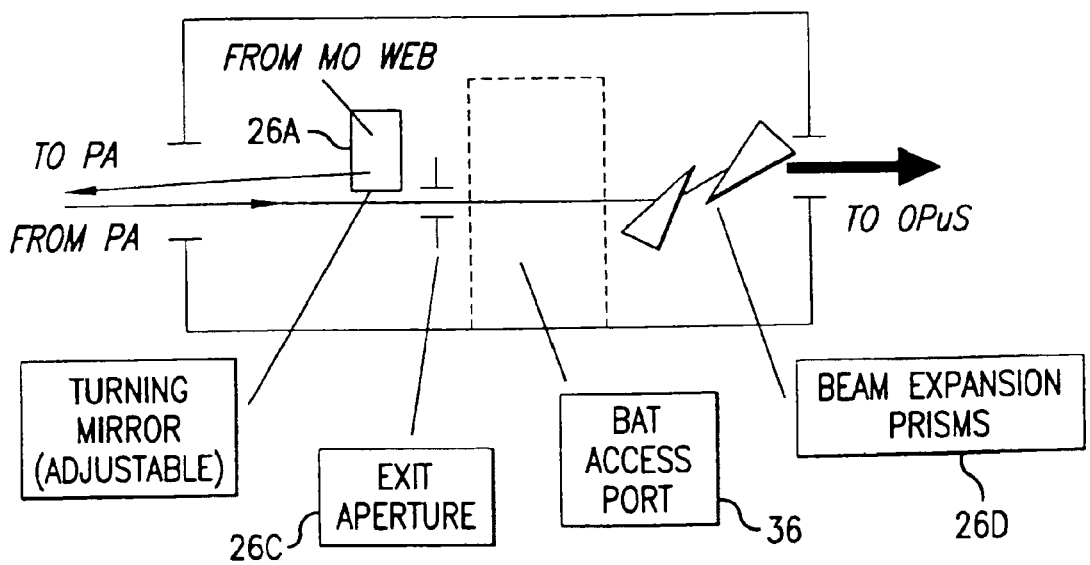

FIGS. 3E (side view) and 3F (top view) show some additional important features of optics in power amplifier WEB module. Note that in the side view, the beam "to" the PA is shown above the beam "from" the PA. This is done so that both beams can be shown in the side view drawing. (Actually both beams are at the same elevation so that the "from" beam would block the "to" beam if the from beam were shown at the correct elevation.). As shown in FIG. 3F the from beam passes close to TIR prism 26A passes through exit aperture 26C, and is expanded by a factor of 4 in the horizontal direction with two beam expanding prism 26D and exits to pulse stretches module 22 (called by Applicants' "OPUS", for optical pulse stretcher). Exit aperture 26C as well as other apertures in the relay optics should be considered optional and they may be replaced by temporary alignment targets.

Other TIR Prism Considerations

TIR prisms in the MO WEB and PA WEB are preferred over dielectric-coated first surface mirrors because they have no optical coatings, which tend to degrade with extended exposure to high fluence UV radiation. One disadvantage of the TIR prisms is unwanted Fresnel reflections that occur at the entrance and exit faces. For calcium fluoride material at 193 nm, each face reflects about 4% of the incident beam. If the incident beam is normal to the surface, the unwanted reflections will propagate back along the path of the incident beam and re-enter the MO. This could interfere with the stable operation of the MO. The problem is avoided by tilting the entrance and exit faces of the TIR prisms by approximately 1 degree relative to the incident beam. This can be accomplished by rotation a 45°-45°-90° TIR prism by 1 degree, in which case the deviation angle of the primary beam will change from 90° to either 88° or 92° (depending on the direction of the 1 degree rotation). Alternatively, a 90° deviation angle and 1 tilted faces can be achieved by using a TIR prism with angles 44°-44°-92° or 46°-46°-88° or 44.33°-45.67°-90°.

The TIR prism 26A in the PA WEB is used very close to an edge of each of the three optical faces. The optical faces of these prisms must be accurately polished to within 1 mm or less of the critical edges.

The TIR prisms in the MO WEB and PA WEB will each be alignable in two degrees of freedom (2 rotations, "tip-tilt"). The MO WEB TIR prism is aligned so that the primary reflected beam is directed to the appropriate location in the PA WEB. The PA WEB TIR prism is aligned so that the primary reflected beam is reflected beam is directed to the appropriate location in the Beam Reverser. Each TIR prism is secured in a mechanical mount which allows the tip-tilt adjustments from outside the sealed module.

The maximum reflected wavefront error is specified as 0.20 wave peak-valley at 633 nm (i.e., 127 nm) across the clear aperture (13 mm×21 mm). The wavefront error across the much smaller beam will be significantly less, though the exact amount depends on the type of aberrations present. If simple curvature is the dominant error (as it generally is with polished flats), the maximum divergence angle error introduced to beam would be about 0.02 mrad in the vertical direction (and much less in the horizontal direction).

Figure 3G:
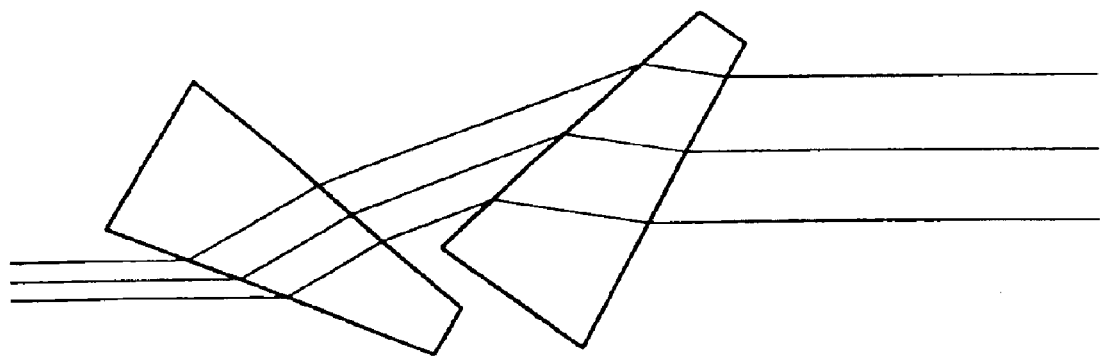

Degradation of the optical coating over life (especially at 193 nm) is a concern, high reflection dielectric coatings that are more damage resistant than partial reflection or AR coatings. Also aiding the goal of long lifetime for this mirror is the fact that the pulse energy is much lower coming out of the MO than coming out of the PA. Because the mirror will be used very close to the edge, the coating may be more susceptible than usual to damage. There may be surface roughness or coating irregularities near the edge that contribute to coating failure. The edge of the mirror preferably is tested to avoid these potential problems. FIG. 3G shows the spacing issues. In order to direct the beam to the appropriate location in the Beam Reverser module, the turning mirror will be aligned in two degrees of freedom (2 rotations, "tip-tilt"). The mirror mount must include adjustments, accessible from outside the sealed module, for aligning the mirror to the required accuracy.

An alternative to the coated mirror 26A is to use an uncoated TIR prism instead of the dielectric-coated mirror. Such a design would eliminate any concern of coating damage over life.

Alignment Features

For this tilted double-pass geometry, the beams reflecting from the MO WEB and the Beam Reverser are precisely positioned in the PA WEB. Alignment features are provided within the PA WEB for proper alignment of the MO WEB mirror and the Beam Reverser. The features would need to reference to the edge of the TIR prism. Preferably the alignment features are apertures, one at the entrance to the PA WEB (for alignment the MO WEB prism) and one at the exit (for aligning the beam reverser). The apertures might be permanent or removable. The system should be alignable in the field with the beam path sealed. Preferably the location of the beam with respect to the apertures will be made visible with some type of 2-D detector array (digital camera). A Beam Analysis Tool called BAT (perhaps with an aperture built-in) may be inserted into the module to inspect the alignment as shown at 36 in FIG. 3F.

Beam Expansion Prisms

Coming out of the PA, the fluence of the beam is higher than anywhere else in the system (due to small beam size and high pulse energy). To avoid having such high fluence incident on the optical coatings in the OPuS module, where coating damage could result, beam expansion prisms were designed into the PA WEB. By expanding the horizontal beam width by a factor of 4, the fluence is reduced to ¼ its previous level.

The beam expansion is accomplished using a pair of identical prisms with 20° apex angle as shown in FIG. 3G. The orientation of the prisms and beam path is shown FIG. 3G.

The prisms are made of ArF-grade calcium fluoride and are uncoated. By utilizing an incidence angle of 68.6° on each prism, anamorphic magnification of 4.0 is achieved, and the nominal deviation angle of the pair is zero. The total Fresnel reflection loss from the four surfaces is about 12%.

Beam Delivery Unit

In this preferred embodiment a pulsed laser beam meeting requirements specified for the scanner machine 2 is furnished at the light input port of the scanner. A beam analysis module as shown at 38 in FIG. 1 called a BAM is provided at the input port of the scanner to monitor the incoming beam and providing feedback signals to the laser control system to assure that the light provided to the scanner is at the desired intensity, wavelength, bandwidth, and complies with all quality requirements such as dose and wavelength stability. Wavelength, bandwidth and pulse energy are monitored by meteorology equipment in the beam analysis module on a pulse to pulse basis at pulse rates up to 4,000 Hz using techniques described in U.S. patent application Ser. No. 10/012,002 which has been incorporated herein by reference.

Other beam parameters may also be monitored at any desired frequency since these other parameters such as polarization, profile, beam size and beam pointing are relatively stable, may be normally monitored much less frequently than the wavelength, bandwidth and pulse energy parameters.

This particular BDU comprises two beam-pointing mirrors 40A and 40B one or both of which may be controlled to provide tip and tilt correction for variations beam pointing. Beam pointing may be monitored in the BAM providing feedback control of the pointing of one or both of the pointing mirrors. In a preferred embodiment piezoelectric drivers are provided to provide pointing response of less than 7 milliseconds.

Fixed Energy Output

Figure 5:
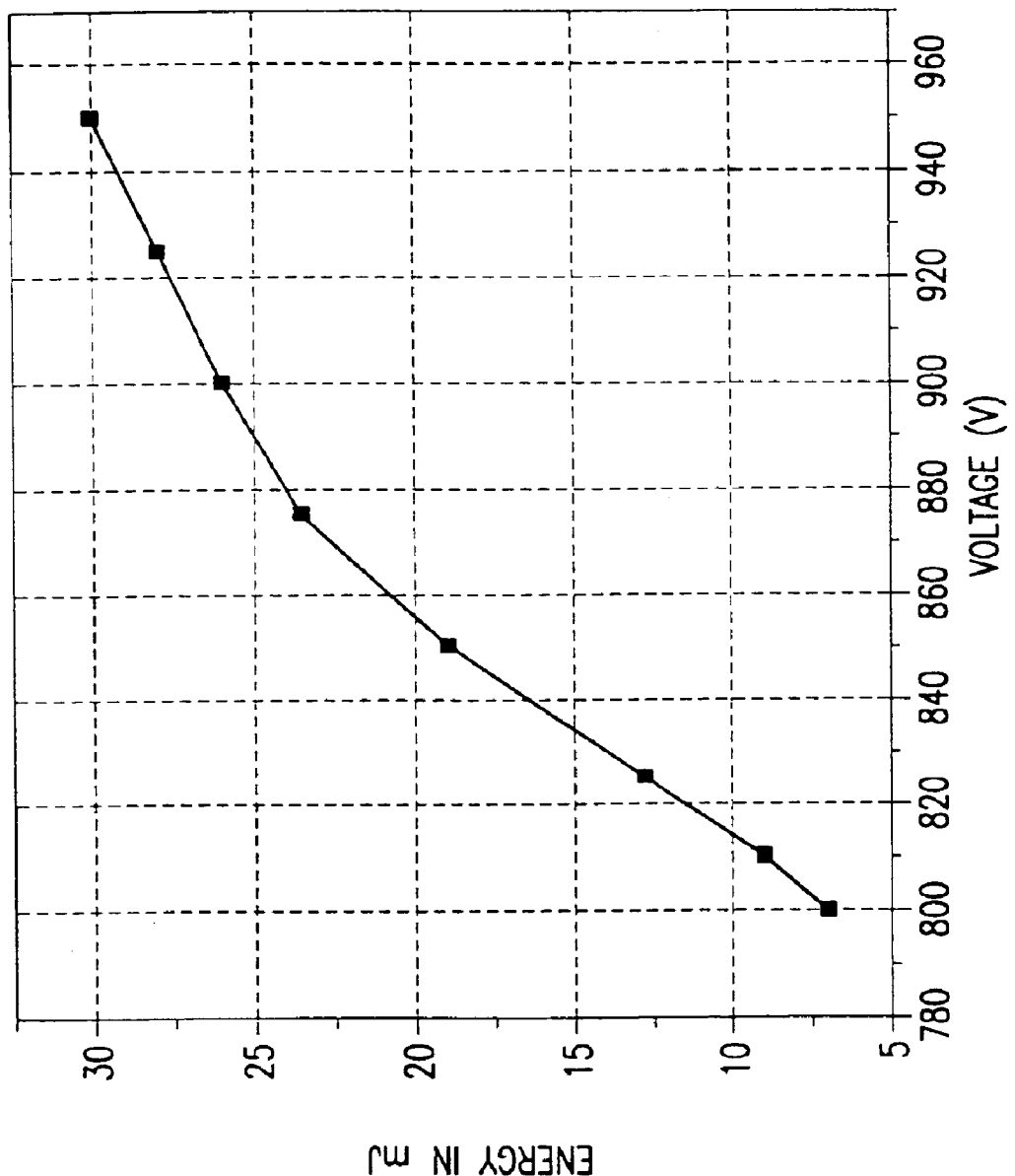
FIG. 5 is a graph of pulse energy versus charging voltage.

In general all optics in the beam path from the gain medium to the silicon wafer degrade over time generally as a function of intensity of the light in each pulse and the number of pulses. However, because of major improvements over the past few years that degradation is slow and is typically measured in billions of pulses. Still, the degradation is significant since, at 4000 Hz, a round-the-clock operation at a 15 percent duty factor, a lithography system will accumulate a billion pulses in a about three weeks. For this reason maintaining constant beam quality can be a challenge. In the past this effort to maintain consistent beam quality over the life of the components of the lithography system has been complicated by the fact that laser beam quality for most laser control functions was measured at the output of the laser system, just downstream from the output coupler. The present invention greatly moderates this problem by providing direct pulse-to-pulse feedback control at the input port of the scanner machine and by supplying the beam delivery unit as a part of the laser system. In this preferred embodiment the beam delivery unit is combined with the above described MOPA system which produces approximately twice the pulse energy as the current state-of-the-art lithography light sources with a reduction in energy intensity and with substantial improvements in beam quality. Therefore, with this arrangement the present invention provides illumination meeting the requirements of the operator of the stepper machine with beam quality and intensity unchanged over the lifetime of the lithography system despite substantial degradation of optical components throughout the length of the beam path. This can be accomplished by intentionally operating the laser system to provide a desired nominal performance at all stages of equipment life. Techniques for intentionally decreasing pulse energy include the usual technique of reducing discharge voltage but also reducing gas pressure of fluorine concentration. Beam attenuation is another possibility. This means that in the early stages of equipment life when all components are new, the laser may be operated so as to produce illumination with less than optimum quality and intensity, but quality and intensity values can be maintained constant (if desired) throughout the life of the lithography system. This approach can substantially increase the useful life not only of the very expensive laser system but also the much more expensive stepper machine. FIG. 5 is a plot of charging voltage vs. pulse energy output for a prototype MOPA laser system built and tested by Applicants. This chart shows that the laser system output can be varied between about 7 mJ to 30 mJ merely by charging the charging voltage. For example, if a nominal operating parameter is 15 mJ, the graph in FIG. 5 demonstrates that there is plenty of excess capacity in the laser to compensate for optics degradation over a long equipment lifetime. Since the MOPA output in this embodiment is 30 mJ per pulse compared to present state-of-the-art laser systems with output of 10 mJ, major lifetime improvements are expected using the above-described plan.

BDU-Part of Laser

Another advantage of providing the laser beam at the entrance port of the scanner is that the beam delivery unit now becomes the responsibility of the laser supplier for not only design and manufacture but also for pro-active preventative maintenance so as to minimize downtime and increase system availability.

Various Laser-BDU-Scanner Configuration

Another advantage is that the beam delivery unit can be designed as part of the laser system to suit the location of the laser with respect to the lithography machine. FIG. 1 shows a typical configuration but most lithography installations are unique and many other configurations are expected to be utilized. Some of the various possible laser—BDU—scanner configurations are shown in FIGS. 4A, 4B, 4C and 4D.

Polarization Considerations

In the master oscillator resonant cavity optical components including two windows and three prisms are oriented with surfaces oriented vertically providing several angles of incident, with the developing laser beam, close to Brewster's angle. Therefore, beam 14A exiting the master oscillator is strongly polarized with about 98 percent of the electric field component of the beam being in the horizontal direction and about 2 percent being in the vertical direction.

Figure 4B:
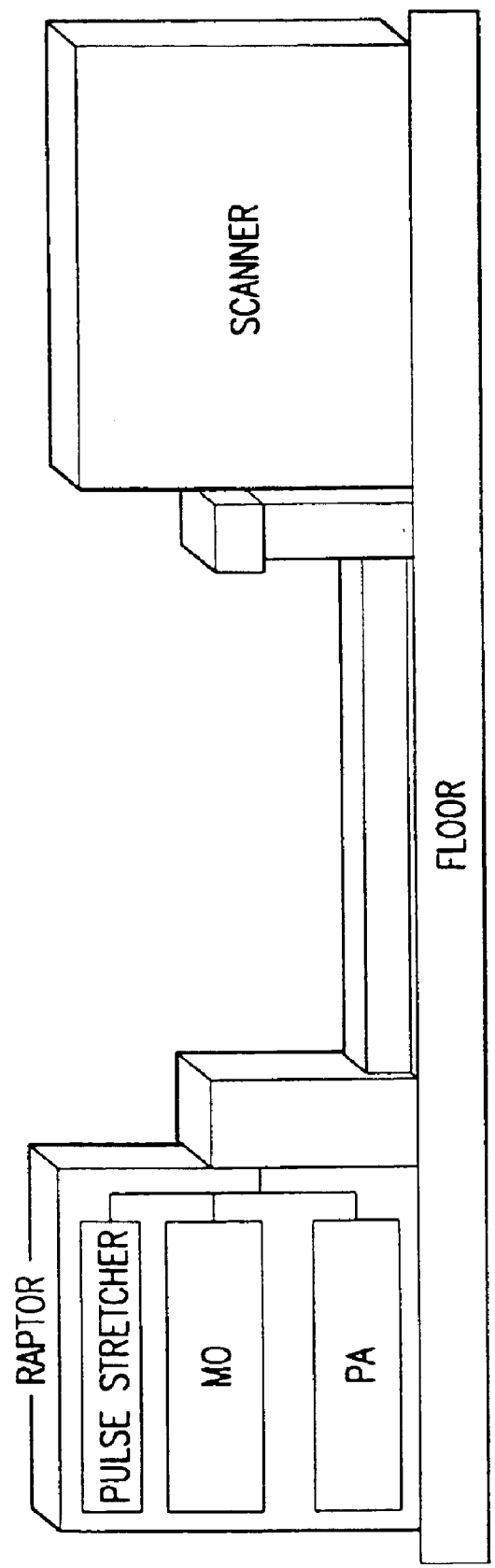
Figure 4C:
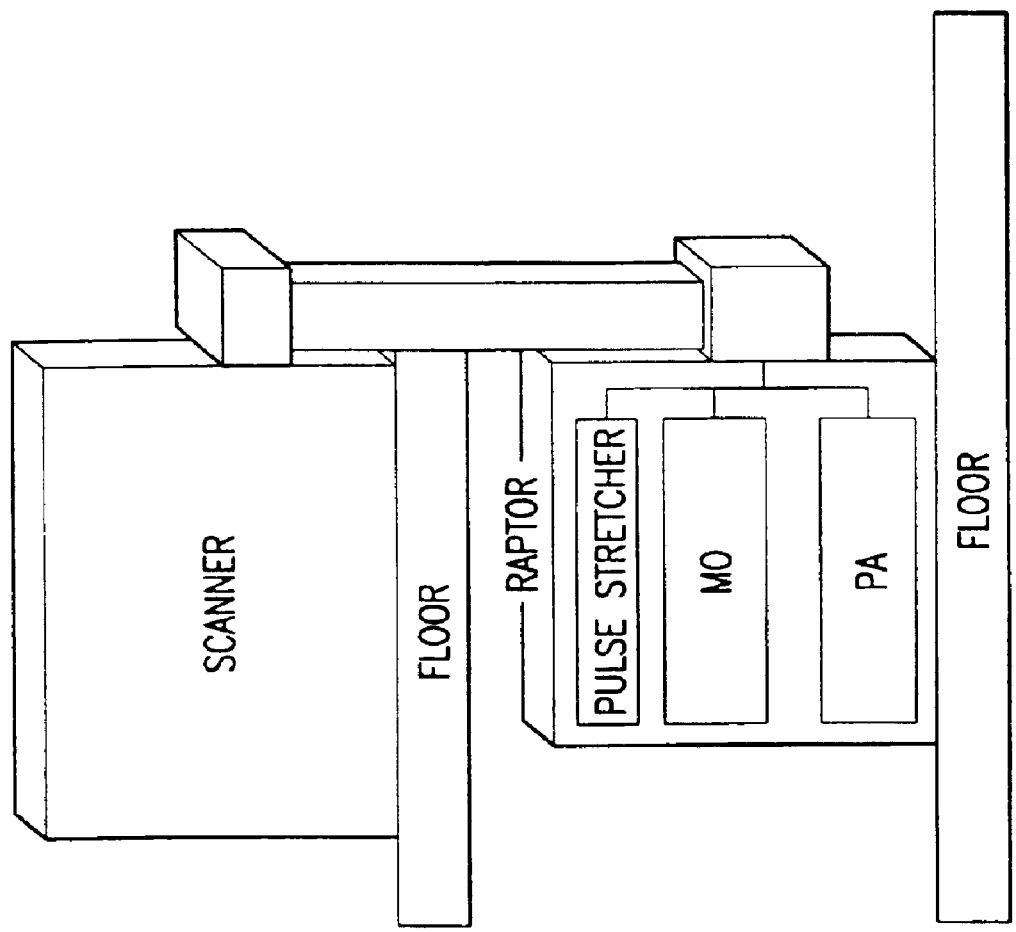

When using dielectric coated mirrors at 45 degrees for beam turning, it is important to take into consideration polarization effects because with these mirrors S-polarization is reflected nearly 97 percent whereas P-polarization is reflected only 90 to 92 percent. (P-polarization refers to the electric field component of the light which is in the plane defined by the beam direction and a line perpendicular to the optical surface at the intersection of the beam direction and the surface. S-Polarization refers to the direction of the electric components of the light in the plane of the surface and perpendicular to the P-polarization). Therefore, to maximize reflection from turning mirrors, it is important that the S-polarization direction corresponds to the polarization of the incoming beam. As the reader will note mirrors 40A and 40B are both oriented so that the S-polarization direction is horizontal corresponding to the electric field direction of about 98 percent of the light in output beam 14C; therefore reflection should be about 97 percent from these mirrors. The mirror shown in the BDU shown in FIGS. 4A, 4B and 4C are all properly oriented from maximum reflection of horizontally polarized light. However, the mirror shown at 52 in FIG. 4D is oriented so that the P-polarization direction is in the direction of the electric field direction of 98 percent of the light in the beam so that reflection by this mirror would be only about 90 to 92 percent. In this case Applicants preferred solution is to utilize two prisms to make the 90-degree beam turn at the 50 location in FIG. 4D. This technique is shown in FIG. 5. Two prisms 52 and 54 with an apex angle of 67.2-degrees (the angle is important) can change the angle of incidence by 90 degrees for the s-polarized light. The beam enters and exits the prism at Brewster angle, so there is no reflection at all of light in the horizontal direction. The portion of the beam polarized in the vertical direction would be mostly reflected by the first prism. The layout is done for 193 nm and $CaF_2$ prisms. (Minor modifications would be needed for 248 nm or 157 nm). Since no coatings are involved, the lifetime of this assembly is very high.

Figure 6:
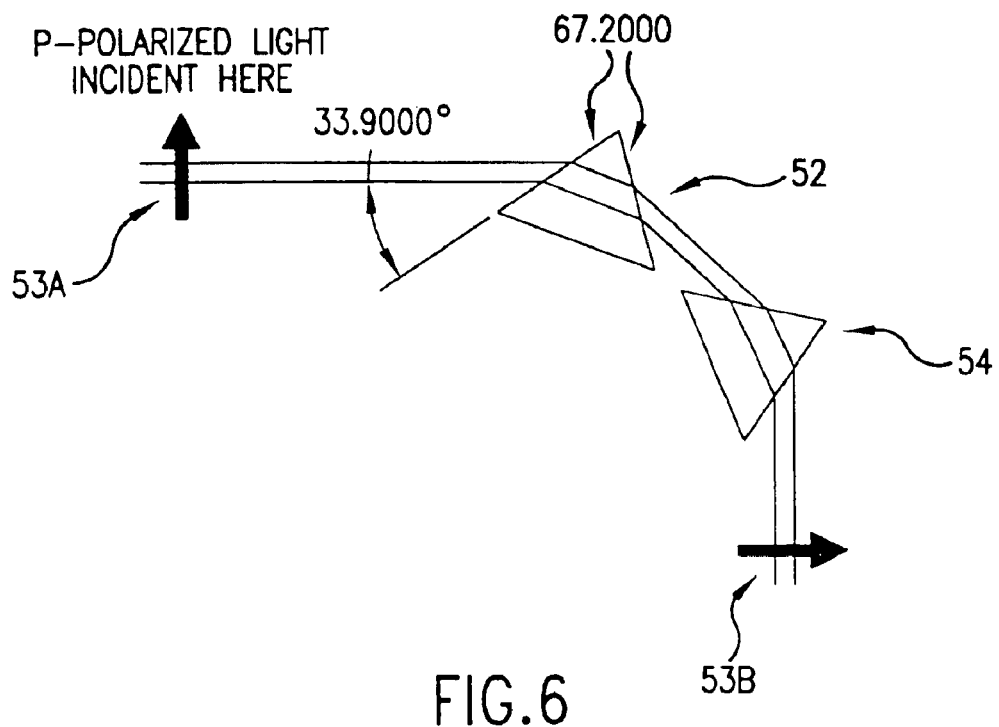
FIG. 6 shows a technique of tuning a beam 90 degrees with prisms.
Figure 7:
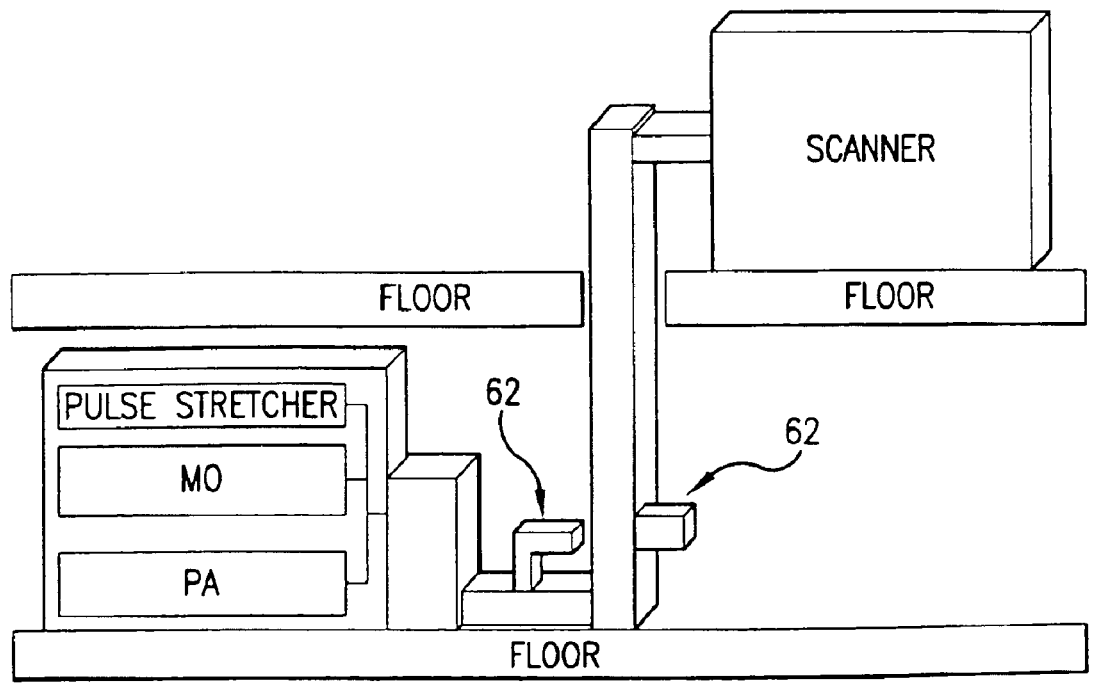
FIG. 7 shows a laser light source with beam delivery to a scanner.

As the horizontal polarized light passes through the two prisms at location 50 in FIG. 4D the direction of polarization of substantially all of the electric field components is reoriented from horizontal to vertical as indicated by arrows 53A and 53B as shown in FIG. 6. For this reason at mirror 56 the electric field components of the beam are substantially all vertical so that mirror 56 mounted vertically provides an s-polarization orientation with respect to the beam and about 97 percent of the light is reflected by mirror 56.

Purge Shutters for Mirrors

The BDU volume could be large, as much as 200 liters and must be purged with high purity $N_2$. This purging process may take several hours to get to the fee ppm level of oxygen and other organics. During the first installation of the BDU to the scanner, this purge time is acceptable, but is considered very long during normal operation. Assume that a mirror, such as mirror 60 in FIG. 4A needs service. This may entail dismantling the mirror from BDU which could expose BDU to air. Hence, what could be a brief service procedure (replacing the mirror) turns into a very long purge procedure. To avoid substantial delays associated with a long purge period to restore the quality of the beam path in the BDU, BDU shutter units 62 are added on both sides of each mirror in the BDU as shown in FIG. 6 for mirror 60. Here, in the BDU are located several inserts where service shutters may be inserted to isolate the other regions in a BDU. These shutters are normally not inserted during operation. For example, as shown in FIG. 6, two shutters are slid between mirror 60 that needs to be isolated and then the mirror itself is replaced. After that, this exposed region is now purged with $N_2$ for a few minutes. The purging interval is much shorter now due to the fact that the volume exposed to air is much smaller than the total volume of the BDU. Preferably during the servicing purging continues in all regions of the beam path other than that between the shutters.

Beam Path Purge

Figure 8:
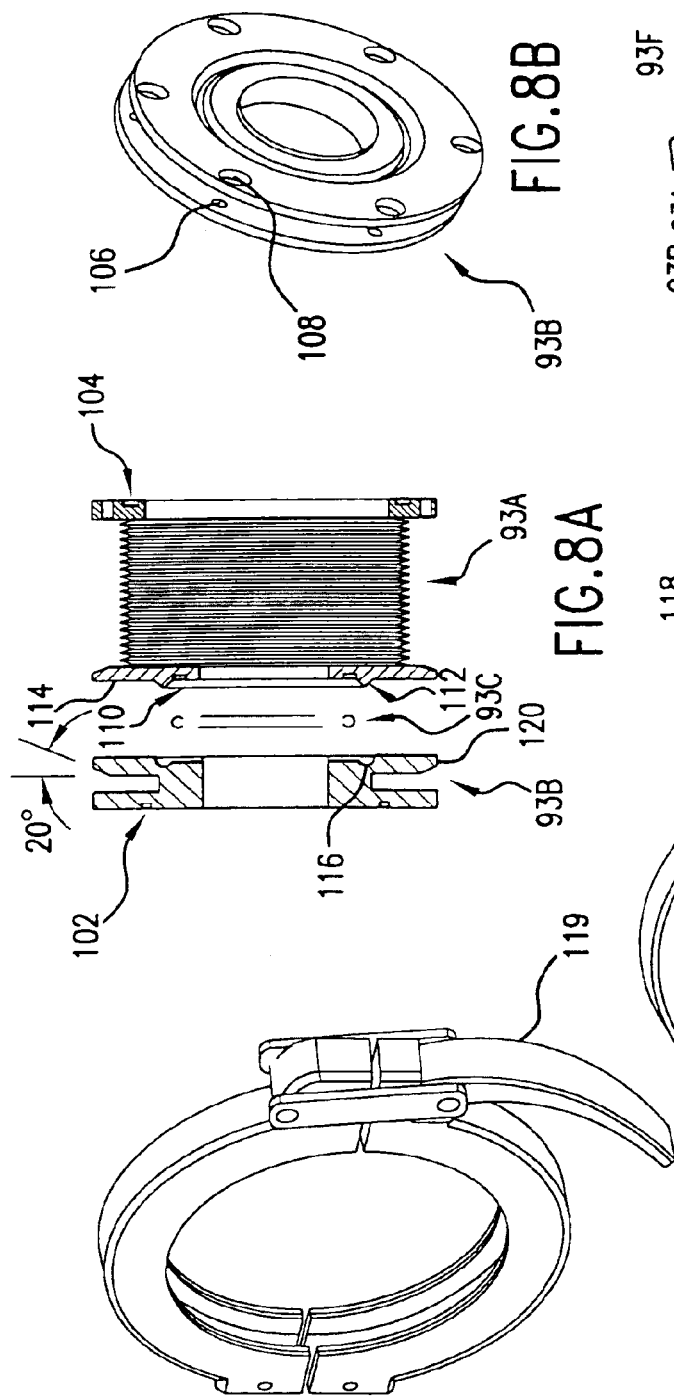
FIGS. 8A–8E shows an easily sealing bellows seal.

In this preferred embodiment all portions of the beam path outside the laser chambers are purged with $N_2$, with two exceptions: (1) The line narrowing package and the portion of the path between laser chamber 8C and the LNP is purged with helium and (2) the etalon chambers in the LAM, SAM and BAM for measuring wavelength and bandwidth are sealed chambers. FIG. 1 shows a purge gas supply at 42 but the purge lines are not shown. Excellent examples of purged beam paths are described in detail in U.S. patent application Ser. No. 10/000,991 which is incorporated by reference herein. This technique includes metal bellows and easy sealing vacuum quality seals at interfaces between the vibrating chambers and the sensitive laser optics and vacuum quality seals at interface between all separate modules permitting quick separation of the modules to permit fast module removal for maintenance or for service. FIGS. 8A through E show drawings of preferred easy sealing bellows seals unit with parts 93A, B and C useful for making connection for components in the beam path from the LNP to the scanner. Either of the clamps shown in FIGS. 8C and 8E can be used to clamp parts 93A and 93B together with the tin coated metal C-seal sandwiched in between. FIG. 8D shows a cut-away of the assembled seal unit. The seals in the seal units are metal "C" seals preferably with a tin contact layer. The metal seals do not deteriorate or out gas contamination under ultraviolet irradiator.

Beam Path Monitor

Preferably monitors are provided to assure the quality of the laser beam path since contamination of the path with absorbers such as oxygen can substantially affect beam quality and pulse energy. Preferably several purge paths will be provided. Flow monitors can be used to monitor purge flow; however, other monitors may also be provided such as $O_2$ monitors which are commercially available from several suppliers. Another beam path quality monitors includes an acoustic monitor utilizing a electret electronic microphone available from suppliers such as Audio Products with offices in Dayton, Ohio. This type of monitor is described in U.S. Pat. No. 10/000,991 which is incorporated by reference herein. In preferred embodiments these monitors are used to provide signals which may be used by the lithography operator to delay fabrication after a shutdown until the beam path purge has sufficiently cleared the beam path of contamination.

Beam Profile Flipping

For integrated circuit fabrication coherence of the laser beam is undesirable. Excimer laser beams characteristically have poor coherence which is one of the many reasons why this light source is good for integrated circuit fabrication. However, as other aspects of the beam quality continue to get better, even the poor coherence of the laser beams from these lasers may not be poor enough. If that turns out to be the case a coherence scrambler can be added. It could be added at several places in the beam path. A good place for it would be anywhere in the beam delivery unit.

Figure 9:
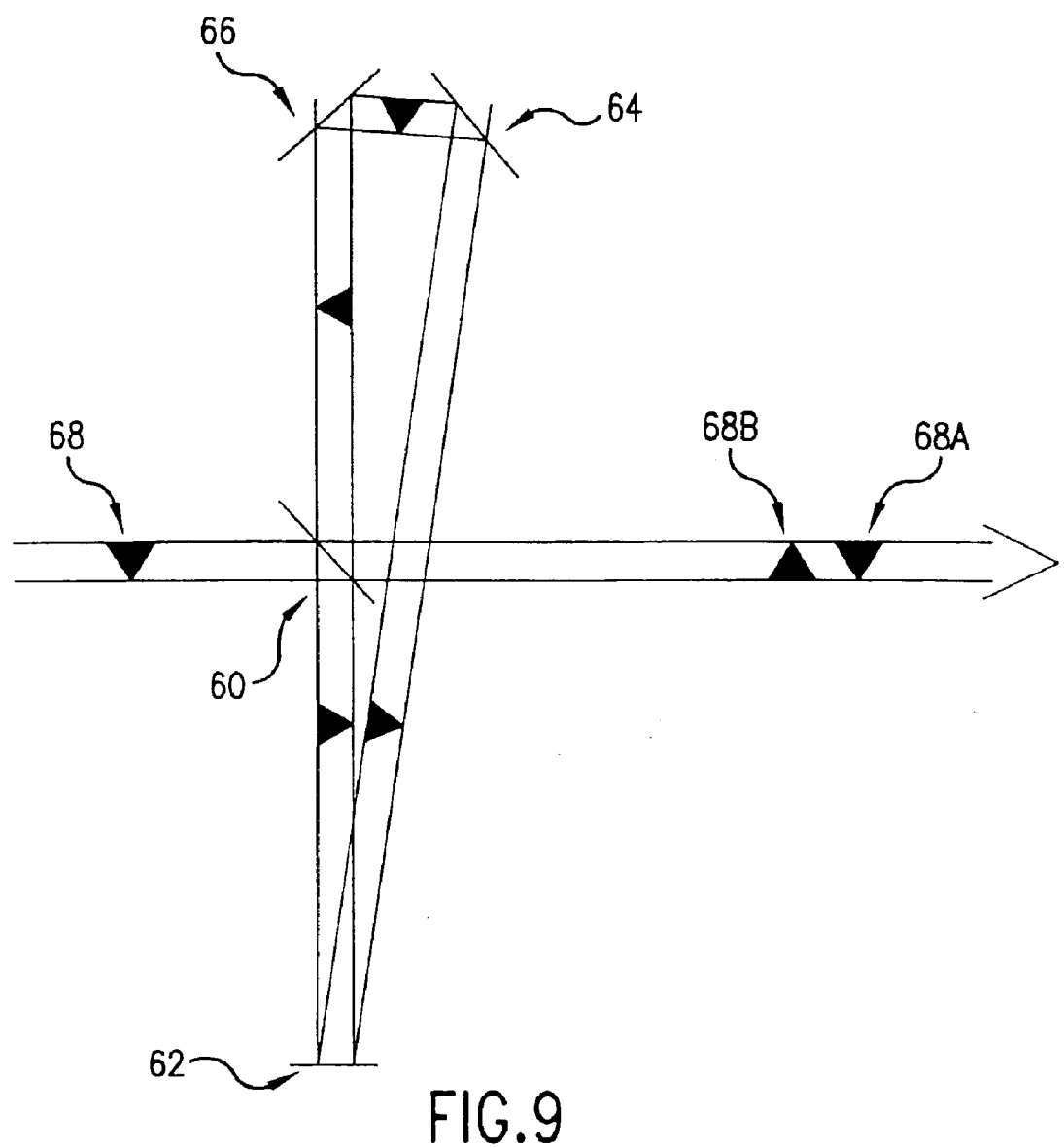
FIG. 9 demonstrates a feature of a preferred pulse stretcher.

FIG. 9 shows an example of a beam profile flipping coherence scrambler. This is produced with a 60 percent beam splitter 60 and three maximum reflection mirrors 62, 64, and 66. This arrangement segregates the pulse into segments in a manner similar to the pulse stretcher discussed above. But with this configuration the profile of each segment is flipped with respect to the preceding segment. In the FIG. 9 example the profile of the incoming pulse 68 is represented with a triangle with a point at the bottom. The first segment, 40% pulse intensity of the passes through with the same profile as shown at 68A. The reflected portion suffers reflection at each of the mirrors and 60 percent of it is reflected from beam splitter 60 that segment has a profile shown at 68B which is flipped with respect to profile 68A. As subsequent segments pass through the coherence scrambler their profiles are each flipped with respect to the preceding segment. Thus, the net profile of the beam will be scrambled and more importantly any coherence will also be scrambled. The reader should note that in this embodiment there will be no significant pulse stretching unless the legs are long enough to provide significant delays of the segments following the first one. Sine we have already stretch the pulse as described above the legs here could be very short such as a few inches in which case the segments will overlap each other.

Pulse Energy Detection at Wafer Plasma

In preferred embodiments of the present invention a pulse energy detector 44 is provided at wafer plane 46 in the scanner. Pulse energy signals this detector may be used in a feed back loop to control the energy output of the laser directly. Alternatively, the signals may be used for the purpose of determining pulse energy parameters as measured at the BAM or the SAM which will provide the illumination needed at the wafer plane.

Special $F_2$ Laser Features

The above descriptions generally apply directly to an ArF laser system but almost all of the features are equally applicable to KrF lasers with minor modifications which are well known in the industry. Some significant modifications are required, however, for the $F_2$ version of this invention. These changes could include a line selector in the place of the LNP and/or a line selector between the two chambers or even downstream of the power amplifier. Line selectors preferably are a family of prisms. Transparent plates properly oriented with respect to the beam could be used between the chambers to improve the polarization of the output beam. A diffuser could be added between the chambers to reduce the coherence of the output beam.

Various modifications may be made to the present invention without altering its scope. Those skilled in the art will recognize many other possible variations.

For example, although the invention, including the utilization of a beam delivery unit, is described using a MOPA laser configuration, a single chamber laser system such as described in U.S. Pat. No. 6,330,261 could be utilized. For lithography either ArF, KrF or $F_2$ systems could be utilized. This invention may also be applied to uses other than lithography in which other ultraviolet wavelength may be more appropriate. An important improvement here is the addition of equipment to a laser system to deliver an ultraviolet laser beam having desire beam qualities to an input port of a equipment needing an ultraviolet laser light source. Various feedback control arrangements other than those referred to herein could be used.

The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many other laser layout configurations other than the one shown in FIG. 1 could be used. For example, the chambers could be mounted side-by-side or with the PA on the bottom. Also, the second laser unit could be configured as a slave oscillator by including an output coupler such as a partially reflecting mirror. Other variations are possible. Fans other than the tangential fans could be used. This may be required at repetition rates much greater than 4 kHz. The fans and the heat exchanger could be located outside the discharge chambers.

Accordingly, the above disclosure is not intended to be limiting and the scope of the invention should be determined by the appended claims and their legal equivalents.

We claim:

1. A delivery module for delivering a laser beam utilized in a manufacturing process from the output of a gas discharge laser to the input of a manufacturing tool utilizing the laser light comprising:

at least three laser beam travel paths providing for at least two changes in direction of the travel of the laser beam;

an enclosure enclosing the beam travel paths and sealing the beam paths from the surrounding environment;

at least two optical elements effecting the at least two changes in direction of the travel of the laser beam;

at least one of the at least two optical elements is an automated optical element having an automated positioner to select the change in direction of the laser light beam effected by the automated optical element;

a delivery unit laser light inlet port receiving a laser beam output of the laser;

a delivery unit laser light outlet port discharging the laser beam to a manufacturing tool light inlet port;

a beam analysis module, located in the delivery unit close to the delivery unit light outlet port, containing measuring equipment for measuring at least one of the beam pulse energy on a pulse by pulse basis and beam pointing and beam position and for providing an output control signal to the laser and to the automated optical element.

2. The apparatus of claim 1 further comprising:

a beam pulse stretcher in at least one of the beam travel paths.

3. The apparatus of claim 2, further comprising:

at least one of the at least two optical elements is a fixed optical element having an orientation mechanism operable from outside the enclosure to select the change in direction of the laser beam effected by the fixed optical element.

4. The apparatus of claim 3 further comprising:

the enclosure including beam analysis equipment comprising a target and beam directors incorporated on a moveable mounting which is insertable in the laser beam path for beam diagnostic purposes and removable from the beam path during normal operation.

5. The apparatus of claim 4 further comprising:

the enclosure is purged.

6. The apparatus of claim 5 further comprising:

the fixed optical element is equipped with a turning wrench extending through the enclosure and sealingly engaging the enclosure such that movement of the fixed optical element can be effected without exposing the beam path inside of the enclosure to the external environment.

7. The apparatus of claim 6 further comprising:

the automated optical element is controlled in tip and tilt based upon a signal provided by the beam analysis module from the group of the beam pointing and beam position output signals of the beam analysis module.

8. The apparatus of claim 7 further comprising:

the enclosure comprises at least two shutter elements insertable into the enclosure on either side of an optical element to maintain the seal of the enclosure on the side of the respective shutter element away from the optical element during maintenance on or replacement of the optical element.

9. The apparatus of claim 2 further comprising:

the enclosure including beam analysis equipment comprising a target and beam directors incorporated on a moveable mounting which is insertable in the laser beam path for beam diagnostic purposes and removable from the beam path during normal operation.

10. The apparatus of claim 9 further comprising:

the enclosure is purged.

11. The apparatus of claim 10 further comprising:

the fixed optical element is equipped with a turning wrench extending through the enclosure and sealingly engaging the enclosure such that movement of the fixed optical element can be effected without exposing the beam path inside of the enclosure to the external environment.

12. The apparatus of claim 11 further comprising:

the automated optical element is controlled in tip and tilt based upon a signal provided by the beam analysis module from the group of the beam pointing and beam position output signals of the beam analysis module.

13. The apparatus of claim 12 further comprising:

the enclosure comprises at least two shutter elements insertable into the enclosure on either side of an optical element to maintain the seal of the enclosure on the side of the respective shutter element away from the optical element during maintenance on or replacement of the optical element.

14. The apparatus of claim 1, further comprising:

at least one of the at least two optical elements is a fixed optical element having an orientation mechanism operable from outside the enclosure to select the change in direction of the laser beam effected by the fixed optical element.

15. The apparatus of claim 14 further comprising:

the enclosure including beam analysis equipment comprising a target and beam directors incorporated on a moveable mounting which is insertable in the laser beam path for beam diagnostic purposes and removable from the beam path during normal operation.

16. The apparatus of claim 15 further comprising:

the enclosure is purged.

17. The apparatus of claim 16 further comprising:

the fixed optical element is equipped with a turning wrench extending through the enclosure and sealingly engaging the enclosure such that movement of the fixed optical element can be effected without exposing the beam path inside of the enclosure to the external environment.

18. The apparatus of claim 17 further comprising:

the automated optical element is controlled in tip and tilt based upon a signal provided by the beam analysis module from the group of the beam pointing and beam position output signals of the beam analysis module.

19. The apparatus of claim 18, further comprising:

the enclosure comprises at least two shutter elements insertable into the enclosure on either side of an optical element to maintain the seal of the enclosure on the side of the respective shutter element away from the optical element during maintenance on or replacement of the optical element.

20. The apparatus of claim 1 further comprising:

the enclosure including beam analysis equipment comprising a target and beam directors incorporated on a moveable mounting which is insertable in the laser beam path for beam diagnostic purposes and removable from the beam path during normal operation.

21. The apparatus of claim 20 further comprising:

the enclosure is purged.

22. The apparatus of claim 21 further comprising:

the fixed optical element is equipped with a turning wrench extending through the enclosure and sealingly engaging the enclosure such that movement of the fixed optical element can be effected without exposing the beam path inside of the enclosure to the external environment.

23. The apparatus of claim 22 further comprising:

the automated optical element is controlled in tip and tilt based upon a signal provided by the beam analysis module from the group of the beam pointing and beam position output signals of the beam analysis module.

24. The apparatus of claim 23 further comprising:

the enclosure comprises at least two shutter elements insertable into the enclosure on either side of an optical element to maintain the seal of the enclosure on the side of the respective shutter element away from the optical element during maintenance on or replacement of the optical element.

25. The apparatus of claim 1 further comprising:

a beam pulse stretcher in at least one of the three beam travel paths, the pulse stretcher comprising:

a beam splitter in the at least one of the beam travel paths passing a selected percentage x % of the laser beam along the beam travel axis of the at least one of the three beam travel paths and reflecting (100−x) % into a beam optical delay path;

the beam optical delay returning the beam to the beam splitter as a first delayed beam;

the beam splitter reflecting (100−x) % of the first delayed beam along the beam travel axis and passing x % of the first delayed beam into the optical delay path as a second delayed beam.

26. The apparatus of claim 25 further comprising:

the optical delay path comprising:

at least one focusing optic in the optical delay path.

27. A delivery module for delivering a laser light pulse utilized in a manufacturing process from the output of a gas discharge laser to the input of a manufacturing tool utilizing the laser light comprising:

a beam delivery unit comprising a beam path enclosure structure providing a laser output light pulse beam path, from a laser beam output port located on said laser to a remote laser beam output port at a terminus of said beam delivery unit;

the beam path enclosure unit having at least one first beam transition section oriented in the direction of the output laser light pulse beam entering the at least one first beam transiting section, and at least one second beam transition section oriented in a different direction from the at least one first beam transition section forming a junction of the at least one first beam transition section and the at least one second beam transition section;

a first turning optic located at the junction and positioned at an angle to the output laser light pulse beam transiting the at least one first transition section, creating a first redirected laser output light pulse beam transiting the at least one second beam transition portion;

a second turning optic located at a terminus of the at least one second beam transition section and positioned to the redirect the first redirected laser output light pulse beam transiting the at least one second transition section, creating a second redirected laser output light pulse beam transiting in the at least one second transition section;

at least one of the first and second turning optics is an automated turning optic having an automated positioner to select the change in direction of the laser output light pulse beam incident upon the automated turning optic;

a delivery module laser output light pulse beam inlet port receiving a laser output light pulse beam from the laser;

a delivery module laser output light pulse beam outlet port discharging the laser output light pulse beam to a manufacturing tool light inlet port;

a beam analysis module, located in the delivery module close to the delivery module outlet port, containing measuring equipment for measuring at least one of the beam pulse energy, on a pulse by pulse basis, and beam direction, and for providing an output control signal to the laser and to the automated turning optic.

28. The apparatus of claim 27, further comprising:

a beam pulse stretcher in the delivery module.

\* \* \* \* \*